(12) United States Patent
Kervran

(10) Patent No.: US 11,540,058 B1
(45) Date of Patent: Dec. 27, 2022

(54) MICROPHONE WITH ADDITIONAL PIEZOELECTRIC COMPONENT FOR ENERGY HARVESTING

(71) Applicant: AAC ACOUSTIC TECHNOLOGIES (SHENZHEN) CO., LTD., Shenzhen (CN)

(72) Inventor: Yannick Pierre Kervran, HK (FR)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 69 days.

(21) Appl. No.: 17/337,434

(22) Filed: Jun. 3, 2021

(51) Int. Cl.
*H04R 17/02* (2006.01)
*H04R 7/02* (2006.01)
*H01L 41/113* (2006.01)

(52) U.S. Cl.
CPC ............ *H04R 17/02* (2013.01); *H01L 41/113* (2013.01); *H04R 7/02* (2013.01)

(58) Field of Classification Search
CPC .......... H04R 7/02; H04R 17/02; H01L 41/113
See application file for complete search history.

(56) References Cited

U.S. PATENT DOCUMENTS

| 7,362,873 | B2 * | 4/2008 | Pedersen | H04R 19/005 |
| | | | | 381/174 |
| 11,032,651 | B2 * | 6/2021 | Duan | H04R 17/02 |
| 2017/0366107 | A1 * | 12/2017 | Chatterjee | H02N 2/22 |

* cited by examiner

*Primary Examiner* — Brian Ensey
(74) *Attorney, Agent, or Firm* — W&G Law Group

(57) ABSTRACT

A microphone with an additional piezoelectric component for energy harvesting is provided, and includes a substrate penetrated through by a cavity, a diaphragm, and a piezoelectric conversion. The diaphragm includes a vibration portion and at least one connecting arm, and two ends of each of the at least one connecting arm are connected to the vibration portion and the substrate, respectively. The piezoelectric conversion component is disposed on one of the at least one connecting arm and configured to convert mechanical energy collected from a displacement of the diaphragm by sound to electrical energy. The piezoelectric conversion component is mounted on the diaphragm, so as to convert the mechanical energy collected from the diaphragm by the sound to the electrical energy, thereby effectively recycling the mechanical energy and avoiding a waste of energy.

8 Claims, 5 Drawing Sheets ial field of
MICROPHONE WITH ADDITIONAL PIEZOELECTRIC COMPONENT FOR ENERGY HARVESTING

TECHNICAL FIELD

The present disclosure relates to the technical field of microphones, and in particular, to a microphone with an additional piezoelectric component for energy harvesting.

BACKGROUND

With the development of wireless communication, there are increasingly more mobile phone users all over the world. The users' requirements for mobile phones are not only limited to calls, but also can provide a high-quality call effect. In particular, with the development of a mobile multimedia technology, the call quality of the mobile phones is more important. As a voice collecting device of the mobile phones, the design of the microphones of the mobile phones directly affects the call quality.

SUMMARY

An objective of the present disclosure is to provide a microphone with an additional piezoelectric component for energy harvesting, which can convert mechanical energy generated on the microphone due to a sound into electrical energy for efficient recovery and reduce a waste of energy, so as to solve the technical problem in the prior art. The additional piezoelectric component is used for energy harvesting, i.e., acting as an energy harvester.

The present disclosure provides an additional piezoelectric component for energy harvesting, and the microphone with the additional piezoelectric component includes a substrate penetrated through by a cavity, a diaphragm, and a piezoelectric conversion component. The diaphragm includes a vibration portion and at least one connecting arm, and two ends of each of the at least one connecting arm are connected to the vibration portion and the substrate, respectively. The piezoelectric conversion component is disposed on one of the at least one connecting arm and configured to convert mechanical energy collected from a displacement of the diaphragm by sound to electrical energy.

As an improvement, the at least one connecting arm includes four connecting arms.

As an improvement, each of the at least one connecting arm acts as a mechanical spring.

As an improvement, an upper part of the cavity is provided with a step, and a plurality of stationary electrodes are equally spaced on the step; a plurality of movable electrodes protrudes from a periphery of the vibration portion; and the plurality of stationary electrodes is arranged in a shape of a comb, the plurality of movable electrodes is arranged in a shape of a comb, the plurality of stationary electrodes is spatially separated from and cross the plurality of movable electrodes, and one of the plurality of stationary electrodes and one of the plurality of movable electrodes cross.

As an improvement, each of the plurality of stationary electrodes includes a first top surface away from the step and a first bottom surface close to the step, and has a first thickness formed between the first top surface and the first bottom surface, each of the plurality of movable electrodes includes a second top surface away from the step and a second bottom surface close to the step, and has a second thickness formed between the second top surface and the second bottom surface, and the first thickness is equal to the second thickness.

As an improvement, the substrate is provided with a plurality of stationary electrode lead-out terminals for energizing the plurality of stationary electrodes, and the at least one connecting arm is provided with a plurality of movable electrode lead-out terminals for energizing the plurality of movable electrodes.

As an improvement, the vibration portion is in a centrally symmetric shape.

As an improvement, the centrally symmetric shape is a circle or a square.

Compared with the prior art, in the present disclosure, the piezoelectric conversion component is mounted on the diaphragm, for example, being mounted on the connecting arm 22 and as close as possible to an anchor with the substrate 1, where the stress is maximized, or any different region depending on the arm geometry where the stress is maximized, so as to convert the mechanical energy collected from the displacement of the diaphragm by the sound to the electrical energy, thereby effectively recycling the mechanical energy and avoiding a waste of energy.

DESCRIPTION OF REFERENCE NUMERALS

Figure 1:
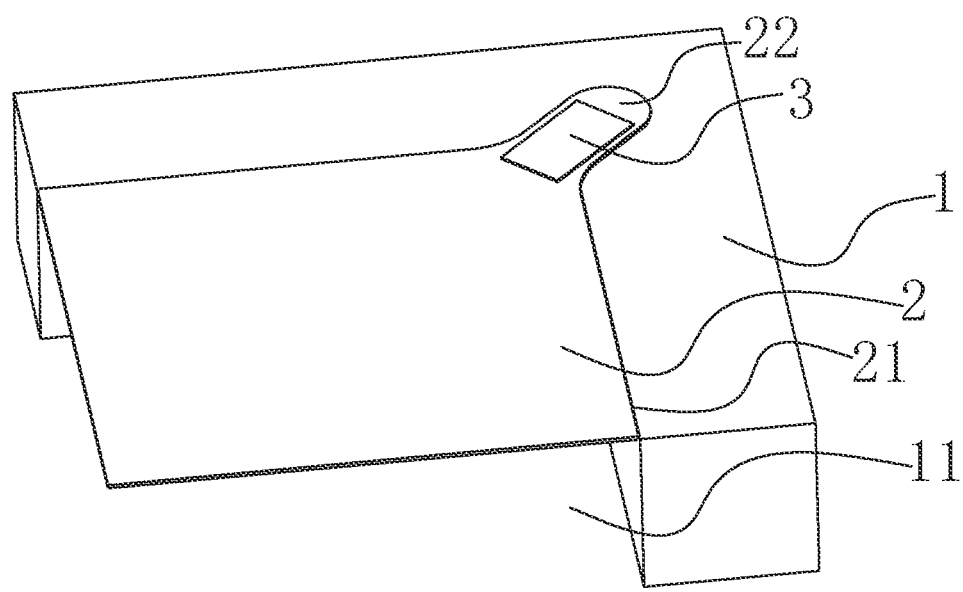
FIG. 1 is a schematic diagram of a microphone of a first embodiment.

1: substrate, 11: cavity, 12: step;
2: diaphragm, 21: vibration portion, 22: connecting arm;
3: piezoelectric conversion component;
4: stationary electrode, 41: first top surface, 42: first bottom surface;
5: movable electrode, 51: second top surface, 52: second bottom surface.

DESCRIPTION OF EMBODIMENTS

Embodiments of the present disclosure will be described in detail in the following descriptions, examples of which are shown in the accompanying drawings. The same or similar elements and elements with the same or similar functions are denoted by like reference numerals throughout the descriptions. The embodiments described below with reference to the accompanying drawings are illustrative, and are used only for construing the present disclosure but cannot be construed as limitations on the present disclosure.

In the related art, the microphone is provided with no device to collect and use the energy of the sound.

Figure 2:
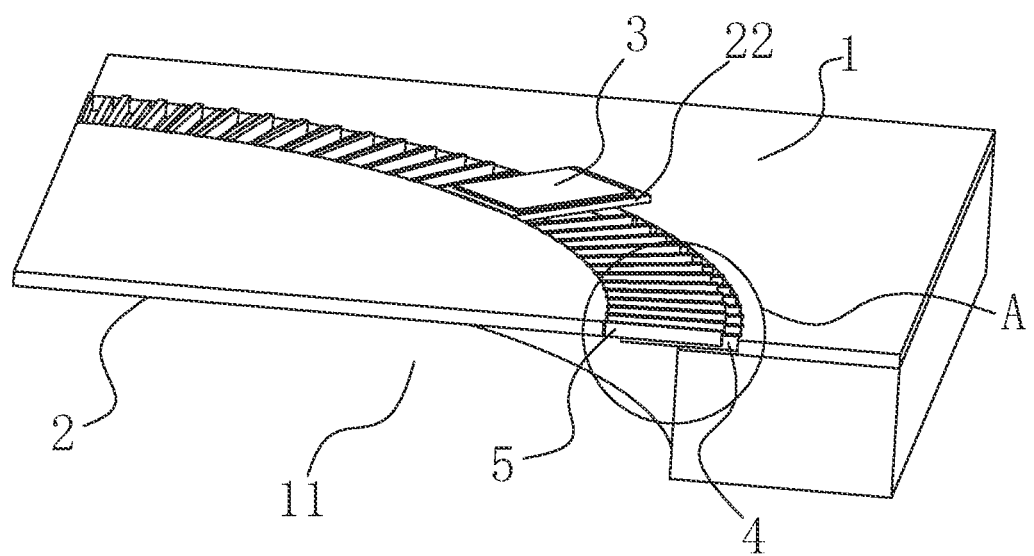
FIG. 2 is a schematic diagram of a microphone of a second embodiment.
Figure 3:
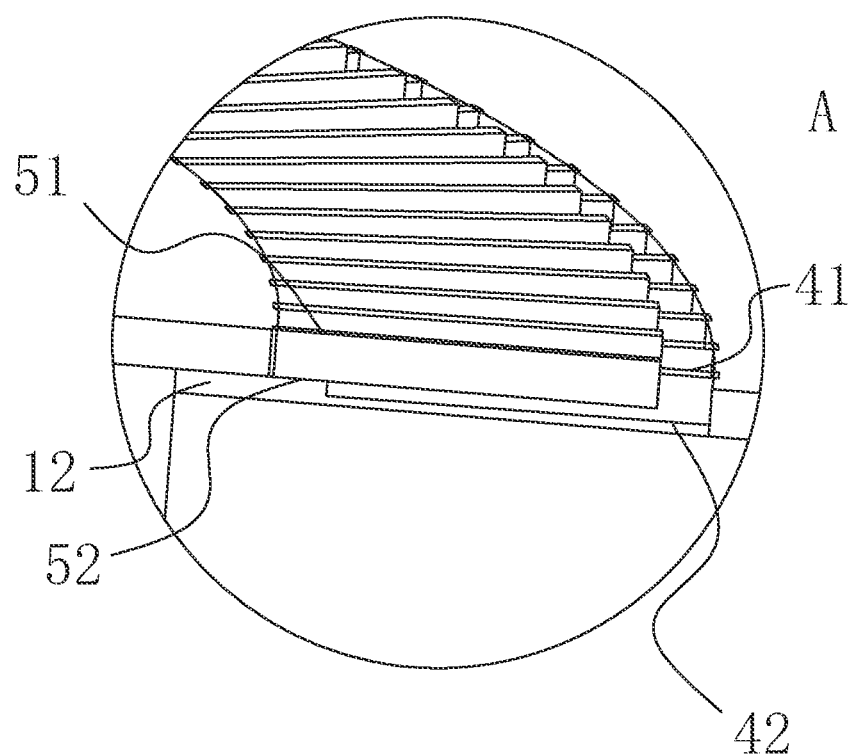
FIG. 3 is an enlarged view of a microphone in circle A shown in FIG. 2.

As shown in FIG. 1 and FIG. 2, an embodiment of the present disclosure provides a microphone with an additional piezoelectric component for energy harvesting, which includes a substrate 1 penetrated through by a cavity 11, a diaphragm 2, and a piezoelectric conversion component 3.

In an embodiment, an inner contour surface of the cavity 11 has a circular structure.

The diaphragm 2 includes a vibration portion 21 and at least one connecting arm 22, and two ends of the connecting arm 22 are connected to the vibration portion 21 and the substrate 1, respectively. For example, a projection of the vibration portion 21 along an axis direction of the cavity 11 covers the cavity 11.

The piezoelectric conversion component 3 is disposed on the connecting arm 22 and configured to convert mechanical energy collected from a deformation of the diaphragm to electrical energy. When the microphone is in use, the sound enters through a sound inlet and actuates vibrations of the diaphragm 2. When the diaphragm 2 vibrates, the diaphragm 2 moves upwards and moves downwards with a particular frequency and displacement, just like a standard oscillating structure. The diaphragm just moves in the direction of the sound, no matter the type of microphone. The frequency depends on a frequency of the sound, and the displacement depends on pressure of the sound.

In the microphone shown in FIG. 1 and the microphone shown in FIG. 2, both case (standard diaphragm/backplate structure or comb-like structure), if the diaphragm is conductive, an electrical insulation layer should be considered to isolate the piezoelectric component and the diaphragm The material and principle of converting mechanical energy to electrical energy utilizing a deformation have been disclosed in the related art. A piezoelectric material of the piezoelectric conversion component 3 generates electrical charges when subjected to physical deformation. An electromechanical relationship of the piezoelectric material depends on parameters, such as, an intrinsic electro-mechanical property (also known as piezoelectric coefficients), manufacturing process parameters, and an electric regulation system.

The piezoelectric material is mechanically related to a mobile structure and is associated with electronic circuits for various purposes, such as power, sensing, signal regulation, or other purposes not mentioned here. The piezoelectric material can be used as an actuator or a sensor. The piezoelectric material can be used as an energy collector to cooperate with a suitable electronic system. The piezoelectric conversion component 3 converts mechanical energy collected from a displacement of the diaphragm 2 by a sound to electrical energy, which can be stored or directly reused.

By use of the technical solution of this embodiment, the mechanical energy generated by the sound can be converted into electrical energy for efficient recovery, and a waste of energy can be avoided.

In a technical solution provided in an embodiment, when the vibration portion 21 is circular, the connecting arm points to a center of the diaphragm 2. In an embodiment, the at least one connecting arm includes four connecting arms equally dividing the diaphragm 2. Those skilled in the art can know that, the number of the connecting arms is not limited to 4, which can be 2, 5, 6, and the like, and is not limited herein.

As an improvement, the connecting arm acts as a mechanical spring of any shape. For example, the connecting arm is a mechanical spring. The spring can be made of the same material as the vibration portion 21 or of another material different from a material of the vibration portion 21, or made of several materials. The spring can be made of monocrystalline silicon, silicon nitride, silicon oxide, polysilicon, polyimide, or a combination thereof.

The spring can be of various shapes to increase the displacement of the diaphragm 2 when the sound is applied on the spring, so as to improve the performance of the microphone. It includes, but is not limited to, a rectangular arm, a curved arm, an arm in a triangular shape, or a combination thereof. Since the sound is everywhere, it is considered that the sound pressure is mostly towards the diaphragm. When the diaphragm displacement is increased, a higher stress is generated, generating more charges in the piezoelectric material.

Figure 4:
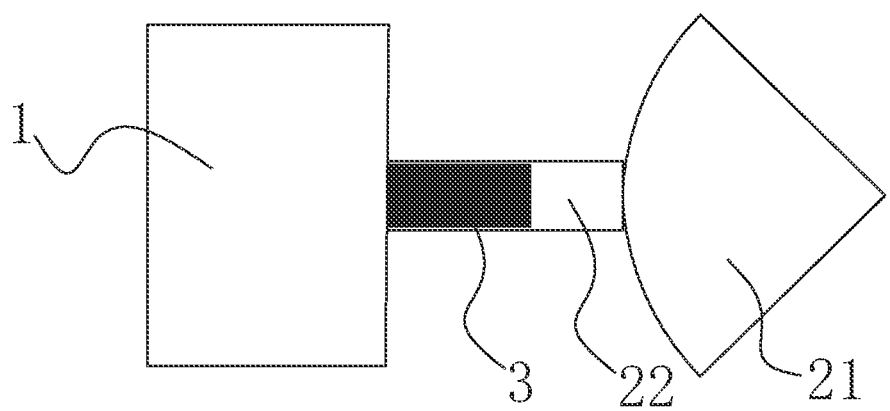
FIG. 4 is a top view of a mounting position of a piezoelectric conversion component.
Figure 5:
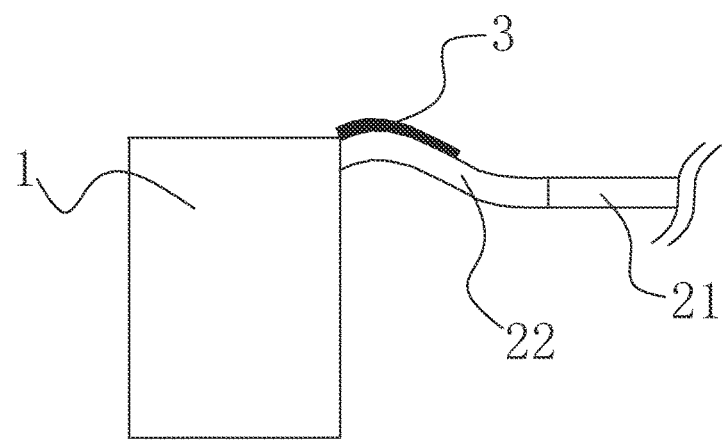
FIG. 5 is a side view showing the piezoelectric conversion component on a vibrating connecting arm.

FIG. 4 is a schematic diagram of a mounting position of the piezoelectric conversion component 3, and FIG. 5 is a side view showing the piezoelectric conversion component 3 on a vibrating connecting arm 22. As shown in FIG. 4 and FIG. 5, the piezoelectric conversion component 3 is disposed on the connecting arm 22. In another embodiment, the piezoelectric conversion component 3 is disposed on the vibration portion 21. Compared with the piezoelectric conversion component 3 being disposed on the vibration portion 21, the piezoelectric conversion component 3 mounted on the connecting arm 22 is made of a piezoelectric material having larger strain and more sensitive. The larger displacement (strain) of the diaphragm will generate larger stress at the anchor of the connecting arm, thereby generating more sensitive piezoelectric signals.

When the piezoelectric conversion component 3 is mounted at the first mounting position, the piezoelectric conversion component 3 can be located on one or more connecting arms, and the number of arms is not limited.

Embodiments of the present disclosure provide microphones of two structures. The microphone having a first structure is a capacitive microphone with diaphragm/backplate sensing. As shown in FIG. 1 where the backplate is not represented therein, the vibration portion 21 of the diaphragm 2 covers the cavity 11, the connecting arm 22 is connected to an upper part of the substrate 1. A backplate, a backplate electrode connected to the backplate, and a diaphragm electrode connected to the diaphragm 2 are also provided, and the backplate is disposed, with a gap, above or below the diaphragm 2. When the microphone is energized, the backplate and the diaphragm 2 can be charged with opposite polarities to form a capacitor. When the diaphragm 2 vibrates with a sound pressure input, the distance between the diaphragm 2 and the backplate is changed, and thus the capacitance of the capacitor system changes, which converts a sound signal into an electrical signal and realizes a corresponding function of the microphone.

The microphone having a second structure, which is provided by an embodiment of the present disclosure is a capacitive microphone with comb sensing. The structure thereof is as follows.

As shown in FIG. 2, an upper part of the cavity 11 is provided with a step 12, and the step 12 is provided with a plurality of stationary electrodes 4 equally spaced. In an embodiment, the plurality of stationary electrodes 4 are annularly equally spaced with an axis of the cavity 11 as a center, and axis extension lines of the plurality of stationary electrodes 4 are concentrated in a center of the cavity 11. The stationary electrodes 4 can be made directly from a monocrystalline substrate 1, which can be a deposited polysilicon layer by LPCVD (Low Pressure Chemical Vapor Deposition) technique or any other deposition technique, or can be a crystalline silicon layer obtained by epitaxial growth process.

A plurality of movable electrodes 5 protrudes from a periphery of the vibration portion 21. In an embodiment, the vibration portion 21 is circular, and axis extension lines of the plurality of movable electrodes 5 are concentrated in a center of the vibration portion 21. One end of the connecting arm 22 away from the vibration portion 21 is connected to the substrate 1, for example, in an elastic connection manner, so that the diaphragm 2 vibrates under the sound.

The stationary electrodes 4 are arranged in a shape of a comb, and the movable electrodes 5 are arranged in a shape of a comb. The stationary electrodes 4 is spatially separated from the movable electrodes 5, and the stationary electrode 4 and the movable electrode 5 cross. Dimensions of the stationary electrodes 4 and the movable electrodes 5 define overlapping regions. When the diaphragm 2 moves upwards and downwards, an overlapping area changes and the capacitance of a sensor changes. In this way, a relationship between the capacitance change and an input pressure sound that drives the diaphragm 2 can be established. This structure provides relatively large displacement, reduces acoustic noise, and provides a high sensitivity, and thus compared with the prior art, a higher performance of the microphone is reached.

In an embodiment, the stationary electrode 4 includes a first top surface 41 away from the step 12 and a first bottom surface 42 close to the step 12, and has a first thickness formed between the first top surface 41 and the first bottom surface 42; and the movable electrode 5 includes a second top surface 51 away from the step 12 and a second bottom surface 52 close to the step 12, and has a second thickness formed between the second top surface 51 and the second bottom surface 52.

Since the value of the capacitance is in a direct proportion to an opposing area between two plates of the capacitor and is in an inverse proportion to a distance between the two plates of the capacitor, i.e., $C=k\varepsilon_0\varepsilon_r S/d$, where k is a constant, $\varepsilon_0$ is a constant, and $\varepsilon_r$ is a constant. After the capacitive microphone is manufactured, the value of $\varepsilon_0\varepsilon_r$ is fixed. S denotes the opposing area between the two plates of the capacitor, and d denotes the distance between the two plates. Therefore, in the capacitive microphone provided in the present application, the stationary electrodes 4 are arranged in a shape of a comb and the movable electrodes 5 are arranged in a shape of a comb, the stationary electrodes 4 are spatially separated from the movable electrodes 5, and the stationary electrode 4 and the movable electrode 5 cross. Therefore, after the stationary electrodes 4 and the movable electrodes 5 are energized, the capacitance is formed between the stationary electrode 4 and the movable electrode 5, and the distance d therebetween remains unchanged. The area depends on an opposing area between the stationary electrode and the movable electrode. Therefore, the microphone provided in this embodiment has a good linearity. At the same time, since the value of the capacitance is not limited to the size of the diaphragm 2, the structure of the diaphragm 2 can be effectively reduced, which is convenient for miniaturization. The number of masks needed for processing is less and the processing technology is simple. Due to the abandonment of the backplate, the volume of the sound cavity is effectively increased. This embodiment can also eliminate the acoustic noise interferences induced by the backplate.

In an embodiment provided by the present disclosure, the first thickness is equal to the second thickness, which can improve the performance of the microphone.

In an embodiment, the substrate 1 is provided with a stationary electrode lead-out terminal for energizing the stationary electrode 4, and the connecting arm 22 is provided with a movable electrode lead-out terminal for energizing the movable electrode 5. And the electrical signals involved in the capacitance sensing should not interfere with the electrical signals involved in the piezoelectric component 3 on the connecting arm 22. Electrical insulation layers can be considered if necessary.

In an embodiment of the present disclosure, the shape of the vibration portion 21 of the diaphragm 2 is not limited to a circle, and can also be a square or in other centrally symmetric shapes.

The vibration portion 21 can be made of a single material or several materials. The vibration portion 21 can be made of monocrystalline silicon, silicon nitride, silicon oxide, polysilicon, polyimide, or a combination thereof.

The structure, characteristics, and effects of the present disclosure are described in detail according to the embodiments illustrated. The above are merely some embodiments of the present disclosure. However, the scope of implementation of the present disclosure is not limited by the drawings. Any change or equivalent modifications made in accordance with the conception of the present disclosure without exceeding the spirit covered by the specification and diagrams, shall fall within the protection scope of the present disclosure.

What is claimed is:

1. A microphone with an additional piezoelectric component for energy harvesting, comprising:
    a substrate penetrated through by a cavity;
    a diaphragm comprising a vibration portion and at least one connecting arm, two ends of each of the at least one connecting arm being connected to the vibration portion and the substrate, respectively; and
    a piezoelectric conversion component disposed on one of the at least one connecting arm and configured to convert mechanical energy collected from a displacement of the diaphragm by sound to electrical energy.

2. The microphone with the additional piezoelectric component as described in claim 1, wherein the at least one connecting arm comprises four connecting arms.

3. The microphone with the additional piezoelectric component as described in claim 1, wherein each of the at least one connecting arm acts as a mechanical spring.

4. The microphone with the additional piezoelectric component as described in claim 1, wherein an upper part of the cavity is provided with a step, and a plurality of stationary electrodes are equally spaced on the step;
    a plurality of movable electrodes protrudes from a periphery of the vibration portion; and
    the plurality of stationary electrodes is arranged in a shape of a comb, the plurality of movable electrodes is arranged in a shape of a comb, the plurality of stationary electrodes is spatially separated from the plurality of movable electrodes, and one of the plurality of stationary electrodes and one of the plurality of movable electrodes cross.

5. The microphone with the additional piezoelectric component as described in claim 4, wherein each of the plurality of stationary electrodes comprises a first top surface away from the step and a first bottom surface close to the step, and has a first thickness formed between the first top surface and the first bottom surface;
    each of the plurality of movable electrodes comprises a second top surface away from the step and a second bottom surface close to the step, and has a second thickness formed between the second top surface and the second bottom surface; and
    the first thickness is equal to the second thickness.

6. The microphone with the additional piezoelectric component as described in claim 4, wherein the substrate is provided with a plurality of stationary electrode lead-out terminals for energizing the plurality of stationary electrodes; and the at least one connecting arm is provided with a plurality of movable electrode lead-out terminals for energizing the plurality of movable electrodes.

7. The microphone with the additional piezoelectric component as described in claim 1, wherein the vibration portion is of a centrally symmetric shape.

8. The microphone with the additional piezoelectric component as described in claim 7, wherein the centrally symmetric shape is a circle or a square.

\* \* \* \* \*